United States Patent [19]

Beriger et al.

[11] 4,051,509
[45] Sept. 27, 1977

[54] APPARATUS FOR COOLING ELECTRICAL DEVICES AT DIFFERENT ELECTRICAL POTENTIALS BY MEANS OF A FLOWING MEDIUM

[75] Inventors: Conrad Beriger, Aarau; Eduard Keller, Wettingen, both of Switzerland

[73] Assignee: BBC Brown Boveri & Company Limited, Baden, Switzerland

[21] Appl. No.: 655,558

[22] Filed: Feb. 5, 1976

[51] Int. Cl.² .................. H01L 25/04; H01L 23/02
[52] U.S. Cl. ................................ 357/82; 357/81;
174/16 HS; 165/80
[58] Field of Search ............ 357/81, 82; 174/16 HS;
165/80, 105

[56] References Cited

U.S. PATENT DOCUMENTS

| | | | |
|---|---|---|---|
| 2,917,685 | 12/1959 | Wiegand | 357/82 |
| 3,573,574 | 4/1971 | Davis | 357/82 |
| 3,586,959 | 6/1971 | Eccles | 357/82 |
| 3,668,506 | 6/1972 | Beasley et al. | 357/82 |

*Primary Examiner*—Andrew J. James
*Attorney, Agent, or Firm*—Werner W. Kleeman

[57] ABSTRACT

An apparatus for cooling electrical devices which are at different electrical potentials by means of a flowing medium, preferably water, wherein the potential difference prevailing between those electrically conductive devices exhibiting the greatest potential difference drops at control electrodes. These control electrodes essentially possess the same potential as the associated electrically conductive devices. The remaining electrically conductive devices are arranged parallel to the aforementioned electrically conductive devices between the control electrodes at equipotential points relative to their own potential.

5 Claims, 2 Drawing Figures

APPARATUS FOR COOLING ELECTRICAL DEVICES AT DIFFERENT ELECTRICAL POTENTIALS BY MEANS OF A FLOWING MEDIUM

BACKGROUND OF THE INVENTION

The present invention relates to a new and improved construction of apparatus for cooling electrical devices at different electrical potentials by means of a flowing medium.

In U.S. Pat. No. 2,917,685 there are taught to the art water-cooled arrangements both with semiconductor diodes connected in series and also in parallel. The cooling bodies with which the diodes are attached either have the cooling water flowing therethrough in succession, so-called series cooling, and/or in parallel, so-called parallel cooling.

Moreover, in order to protect electrical devices from electrolytic corrosion it is equally known, for instance from German Pat. No. 938,197, that with series connected protective- or so-called sacrifice electrodes or the like the potential difference between the electrically conductive parts in contact with the cooling agent does not drop at such, rather at the protective electrodes which possess the same potential as the conductive parts.

SUMMARY OF THE INVENTION

Hence, it is a primary object of the present invention to provide a new and improved cooling apparatus of the character described wherein electrolytic corrosion can be maintained at a minimum without having to provide protective electrodes at all electrical devices and without the infeed hoses to the individual electrical devices having to be particularly long and/or having to possess a particularly constricted cross-section.

Another object of the present invention aims at the provision of a new and improved construction of apparatus for cooling electrical devices at different electrical potentials by means of a flowing medium without any appreciable danger of there occurring significant electrolytic corrosion at the electrical devices.

Yet a further object of this invention aims at the provision of a new and improved construction of apparatus for cooling electrical devices at different electrical potentials by means of a flowing medium wherein it is possible to avoid a complicated arrangement requiring protective electrodes at each of the electrical devices to be cooled.

Now in order to implement these and still further objects of the invention, which will become more readily apparent as the description proceeds, the inventive cooling apparatus is manifested by the features that the potential difference which prevails between the electrically conductive devices having the greatest potential difference and in contact with the cooling agent drops at control electrodes. These control electrodes essentially exhibit the same potential as the electrically conductive devices, and parallel to these devices there are arranged further electrical devices between the control electrodes at equipotential points relative to their own potential.

It has been found to be particularly useful to arrange the electrical devices between two pressure tubes formed of electrically insulating material. The tubes serve for the infeed and outfeed of the cooling agent and the control electrodes are likewise arranged therein.

The tubular conduits or hoses through which there flows the cooling agent to the electrical devices, can be maintained very short with this arrangement without there arising any appreciable corrosion of the electrical devices.

The novel apparatus of this development, among other things, is suitable for the cooling of high-performance or heavy-duty semiconductor components, wherein the electrical devices are cooling plates between which there are located the components to be cooled.

BRIEF DESCRIPTION OF THE DRAWINGS

The invention will be better understood and objects other than those set forth above, will become apparent when consideration is given to the following detailed description thereof. Such description makes reference to the annexed drawings wherein.

DETAILED DESCRIPTION OF THE PREFERRED EMBODIMENTS

Figure 1:
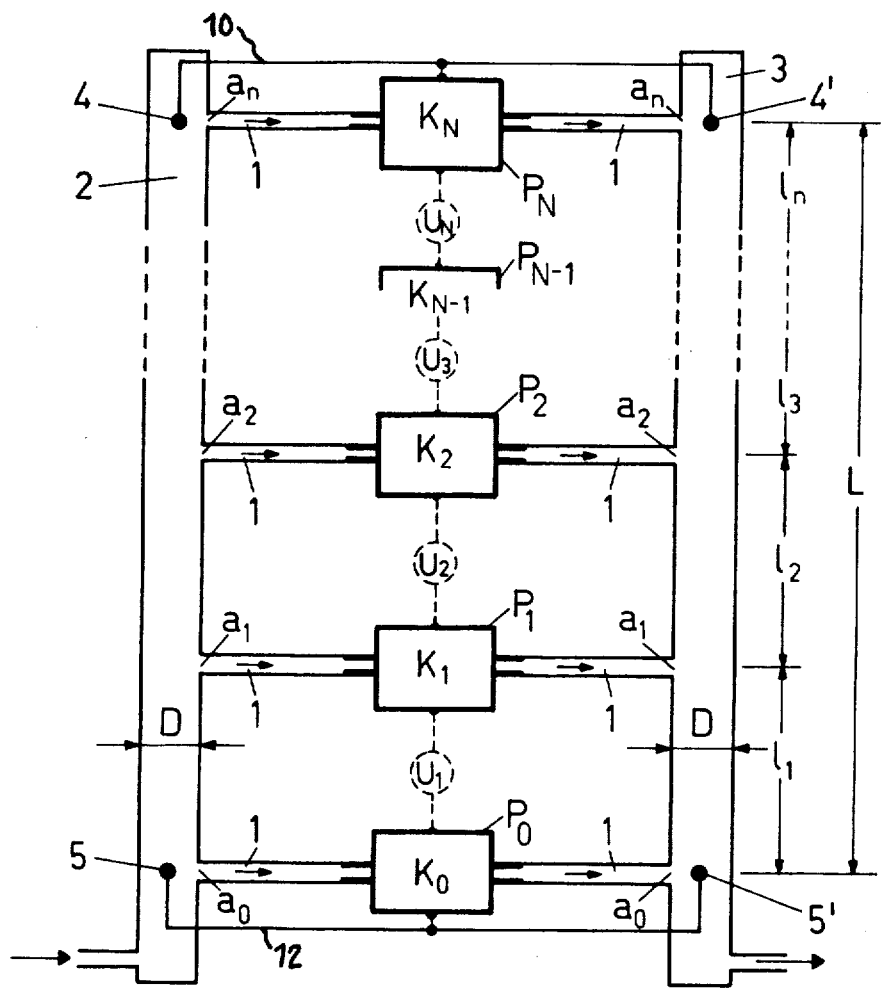
FIG. 1 schematically illustrates a cooling apparatus having a number of cooling bodies located at different electrical potentials.

Describing now the drawings, in FIG. 1 reference characters $K_o$, $K_1$, ... $K_N$ designate cooling bodies, for instance cooling plates for high-performance electrically conductive components, which are at different electrical potentials. The cooling body having the lowest electrical potential $P_o$ has been designated by reference character o and the cooling body having the highest electrical potential $P_N$ by reference character N. The cooling bodies $K_o$, $K_1$... $K_N$ are connected by means of insulating tubular conduits or pipes 1 at two pressure or flow tubes 2 and 3 or the like which possess the same length and have the same diameter D. The cooling agent or coolant, preferably deionized water, flows into and out of such tubes or pipes, and it should be recognized that the arrows conveniently indicate the direction of flow of the coolant agent. In the pressure tubes 2, 3 there are located in each instance two control or auxiliary electrodes 4, 5 and 4', 5' respectively. The control electrodes 4 and 4' are electrically connected with the cooling body $K_N$ by conductor 10 and possess the same potential as such cooling body, and similarly, the control electrodes 5, 5' are electrically connected by conductor 12 with the cooling body $K_o$ and likewise possess the same potential as such cooling body.

By means of the control electrodes 4, 4' and 5, 5' there is achieved the result that any electrolysis of the cooling agent caused by the potential difference $U_g = |P_N - P_o|$ does not occur at the conductive components of the cooling bodies $K_o$ and $K_N$, rather at the control electrodes 4, 4' and 5, 5' respectively.

Moreover, the remaining cooling bodies $K_1 ... K_{N-1}$ which are at different electrical potentials are likewise connected by means of insulating tubular conduits or pipes 1 with the pressure tubes or pipes 2,3. In order to prevent that, owing to the prevailing potential difference $U_1 = |P_1 - P_o|$, $U_2 = |P_2 - P_1|$, ..., $U_N = |P_N - P_{N-1}|$, there occurs at such cooling bodies $K_1, ... K_{N-1}$ electrolytic corrosion, they are connected with the pressure tubes 2 and 3 at equipotential points $a_1, \ldots, a_{n-1}$ relative to their own potential. It will be seen from the showing of FIG. 1 that reference character $a_n$ constitutes the equipotential points at the region of the control electrodes 4, 4' and reference character $a_o$ the equipotential points at the region of the control electrodes 5, 5' and which correspond to the potential of the cooling bodies $K_N$ and $K_o$ respectively.

The electrolysis current $I_g$ which flows in each instance from the control electrodes 4, 5 to the control electrodes 4', 5' in this case is equal to the partial currents $I_1, I_2, \ldots, I_N$ which flow in the pressure tubes between the equipotential points $a_o, a_1, \ldots, a_n$.

Assuming that reference character L constitutes the spacing between the control electrodes 4 and 5 and 4' and 5' respectively, and if reference characters $1_1, 1_2, \ldots, 1_n$ constitute the spacing between the equipotential points $a_o, a_1, \ldots, a_n$ respectively, and if the symbol ϰ designates the conductivity of the cooling agent, then from the relationships:

$I_g 32 U_g/R_g, I_1 = U_1/R_1, \ldots, I_n = U_n/R_N,$ wherein
$R_g = ϰ^{-1} L/(D^2 \pi^2/4), R_1 = ϰ^{-1} 1_1/(D^2 \pi^2/4), \ldots$
$, R_n = ϰ^{-1} 1_n(D^2\pi^2/4),$ results in:
$1 \gamma/U\mu = L/U_g$ with $v = 1, \ldots, n; \mu = 1, \ldots, N$ For given values of $L, U_g, U_1, \ldots, U_N$ there thus can be immediately obtained the connection points of the cooling bodies $K_1, \ldots, K_{N-1}$ at the pressure tubes 2, 3 required for avoiding electrolytic corrosion, and without there being necessary any further control electrodes.

The closest spacing measured in centimeters between the electrical $K_o, K_1, \ldots K_N$ along the cooling agent path always should possess a value $\geq U\mu/1000$ wherein $\mu = 1, \ldots, n$. In corresponding manner there also must be selected the spacing L measured in centimeteers between the control electrodes 4, 5 and 4', 5' in such a manner that there is satisfied the relationship $L \geq Ug/1000$.

Figure 2:
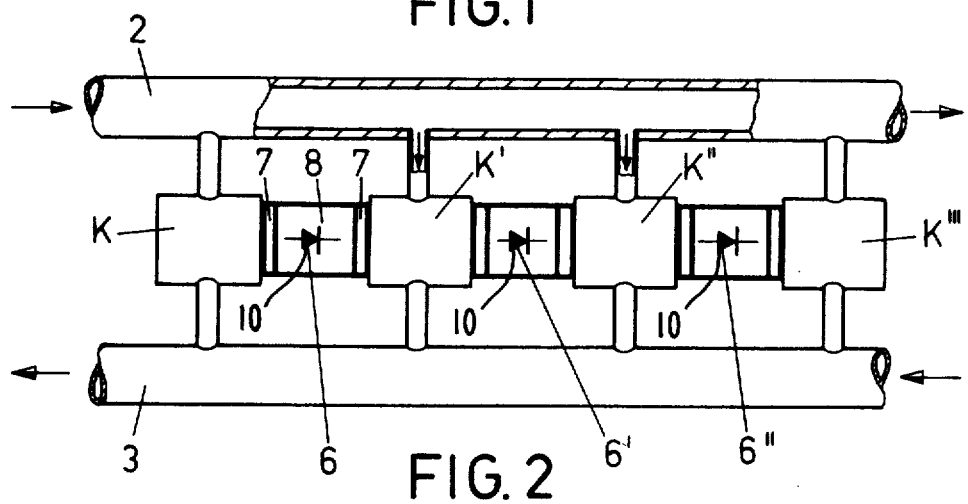
FIG. 2 schematically illustrates a sectional detail of such cooling apparatus wherein semiconductor elements or components are arranged between the cooling bodies.

FIG. 2 shows a sectional detail of such parallel arranged cooling apparatus wherein for instance there are located semiconductor diodes between the cooling bodies. Reference characters 2 and 3 again designate the pressure or flow tubes and reference characters K, K', K" and K''' designate the cooling bodies. The semiconductor components 6, 6' and 6" which are to be cooled consist of two metallic connection caps 7 and an active component, indicated by the reference character 10, which is located in an insulating housing 8. The cooling bodies K, K', K", and K''' which are in contact with the connection caps 7 are likewise composed of metal and are assigned both the function of cooling the semiconductor diodes 6, 6', 6" as well as also of establishing therebetween the electrical connection.

Such a cooled series circuit of semiconductor diodes is particularly suitable for use as a voltage rectifier in high-performance or heavy-duty installations.

While there are shown and described present preferred embodiments of the invention, it is to be distinctly understood that the invention is not limited thereto, but may be otherwise variously embodied and practiced within the scopy of the following claims. ACCORDINGLY,

What is claimed is:

1. An apparatus for cooling electrical devices at different electrical potentials by means of a flowing cooling medium and for preventing corrosion thereof, comprising a plurality of electrically conductive devices at different electrical potentials, means for circulating a cooling agent for cooling the electrically conductive devices, control electrodes in contact with the cooling agent, means for connecting the control electrodes with predetermined ones of said electrically conductive devices such that the greatest potential difference between the electrically conductive devices drops at the control electrodes to avoid corrosion effects at the electrically conductive devices, said control electrodes essentially possessing the same potential as the electrically conductive devices having the greatest potential difference with which said control electrodes are connected, means for connecting the remaining electrically conductive devices between the control electrodes parallel to said electrically conductive devices having the greatest potential difference and at equipotential points relative to their own potential.

2. The apparatus as defined in claim 1, wherein the means for circulating the cooling agent comprises two flow tubes each formed of electrically insulating material, the electrically conductive devices being connected with said two flow tubes for the flow of cooling agent between the flow tubes and the electrically conductive devices, said control electrodes being arranged in said flow tubes.

3. The apparatus as defined in claim 2, wherein said two flow tubes possess essentially the same diameter and the same length.

4. The apparatus as defined in claim 1, wherein the electrically conductive devices comprise metallic cooling plates between which there are arranged semiconductor elements which are to be cooled.

5. An apparatus for cooling electrical devices at different electrical potentials by means of a flowing cooling medium, comprising a plurality of electrically conductive devices at different electrical potentials, means for circulating a cooling agent for cooling the electrically conductive devices, control electrodes arranged for contact by said cooling agent, means for connecting the control electrodes with predetermined ones of said electrically conductive devices such that the greatest potential difference between the electrically conductive devices appears at the control electrodes in order to thus carry the entire corrosion current flowing through the cooling agent and to thereby substantially prevent corrosion effects from occuring at the electrically conductive devices, and means for connecting the remaining electrically conductive devices between the control electrodes parallel to said electrically conductive devices having the greatest potential difference and at essentially equipotential points relative to their own potential.

* * * * *